(12) United States Patent
Nishimoto et al.

(10) Patent No.: US 10,546,718 B2
(45) Date of Patent: Jan. 28, 2020

(54) HIGH VOLTAGE POWER SUPPLY DEVICE AND CHARGED PARTICLE BEAM DEVICE

(71) Applicant: HITACHI HIGH-TECHNOLOGIES CORPORATION, Minato-ku, Tokyo (JP)

(72) Inventors: Takuma Nishimoto, Tokyo (JP); Wen Li, Tokyo (JP); Hiroyuki Takahashi, Tokyo (JP); Hajime Kawano, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 47 days.

(21) Appl. No.: 16/060,197

(22) PCT Filed: Dec. 8, 2015

(86) PCT No.: PCT/JP2015/084353
§ 371 (c)(1),
(2) Date: Jun. 7, 2018

(87) PCT Pub. No.: WO2017/098573
PCT Pub. Date: Jun. 15, 2017

(65) Prior Publication Data
US 2018/0366296 A1    Dec. 20, 2018

(51) Int. Cl.
*H01J 37/00* (2006.01)
*H01J 37/24* (2006.01)
(Continued)

(52) U.S. Cl.
CPC ............ *H01J 37/241* (2013.01); *H01J 37/06* (2013.01); *H01J 37/244* (2013.01);
(Continued)

(58) Field of Classification Search
CPC ........ H01J 37/241; H01J 37/06; H01J 37/244; H01J 2237/2448; H01J 2237/0473;
(Continued)

(56) References Cited

U.S. PATENT DOCUMENTS

| | | | |
|---|---|---|---|
| 2011/0240855 A1* | 10/2011 | Ohshima | H01J 37/065 250/310 |
| 2015/0255240 A1* | 9/2015 | Ichimura | H01J 1/16 205/646 |

FOREIGN PATENT DOCUMENTS

| | | |
|---|---|---|
| JP | 55-002302 A | 1/1980 |
| JP | 2008-203075 A | 9/2008 |

OTHER PUBLICATIONS

Shigemasa Ota et al., "Technology of Measuring Contact Holes Using Electric Charge in a Specimen" Jeol News; vol. 37E, No. 1, pp. 54-58.

* cited by examiner

*Primary Examiner* — Michael Maskell
(74) *Attorney, Agent, or Firm* — Miles & Stockbridge, P.C.

(57) ABSTRACT

Even in a case where a disturbance is applied from an adjacently disposed power supply circuit or the like, in order to realize a reduction in ripple, a high-voltage power supply device is configured to include a drive circuit, a transformer that boosts an output voltage of the drive circuit, a boost circuit that further boosts a voltage boosted by the transformer, a shield that covers the transformer and the boost circuit, a filter circuit that filters, smoothes, and outputs a high voltage output from the boost circuit, and an impedance loop circuit configured by connection of a plurality of impedance elements into a loop shape. A grounding point of the boost circuit, a grounding point of the shield, and a grounding point of the filter circuit are configured to be (Continued)

grounded via the impedance loop circuit, and this is applied to a high-voltage power supply unit that applies a high voltage to an electron gun of a charged particle beam apparatus.

10 Claims, 10 Drawing Sheets

(51) Int. Cl.
*H01J 37/244* (2006.01)
*H01J 37/06* (2006.01)

(52) U.S. Cl.
CPC . *H01J 2237/026* (2013.01); *H01J 2237/0473* (2013.01); *H01J 2237/2448* (2013.01)

(58) Field of Classification Search
CPC ........... H01J 2237/026; H01J 2237/281; H01J 2237/24535
USPC ................................. 250/306, 307, 310, 311
See application file for complete search history.

HIGH VOLTAGE POWER SUPPLY DEVICE AND CHARGED PARTICLE BEAM DEVICE

TECHNICAL FIELD

The present invention relates to a charged particle beam apparatus and a high-voltage power supply for an electron gun of the charged particle beam apparatus.

BACKGROUND ART

A charged particle beam apparatus is widely used for length measurement or pattern inspection of a semiconductor wafer. In recent years, in order to inspect a deep groove or a deep hole in a semiconductor process with a three-dimensional structure, there has been a demand for a high voltage of an acceleration voltage for generating and accelerating a charged particle beam in the charged particle beam apparatus. Further, in order to achieve high resolution of a measurement image, there has been a demand for a ripple reduction of a high-voltage power supply that generates various types of high voltages including the acceleration voltage.

Additionally, since the high-voltage power supply handles several kilovolts to tens of kilovolts, it is necessary to detect an overcurrent flow due to a high-voltage discharge or a component failure with high accuracy and to stop an operation safely. In addition, since the charged particle beam is generated from a load current that is supplied from the high-voltage power supply, there has been a demand for a high-voltage power supply that is capable of detecting the load current with high accuracy in order to obtain the measurement image having the high resolution.

PTL 1 discloses a high-voltage power supply for an electron gun of a charged particle beam apparatus, which avoids false detection and detects an output current with accuracy by grounding a shield of a transformer to a potential portion that is generated by a shunt resistor for overcurrent detection.

In addition, NPTL 1 discloses a charged particle beam apparatus including means for detecting a defect with high accuracy by detecting an absorption current.

CITATION LIST

Patent Literature

PTL 1: JP-A-55-002302

Non-Patent Literature

NPTL 1: Shigemasa Ota, etc. JEOL News, vol. 37E No. 1 54 to 58 (2002)

SUMMARY OF INVENTION

Technical Problem

Incidentally, in a high-voltage power supply device of a charged particle beam apparatus, in order to obtain a measurement image having the high resolution, it is necessary to highly stabilize an output voltage and to reduce the ripple. Currently, an amount of ripple is about 10 ppm; however, in order to achieve higher resolution in the future, it is necessary to reduce the amount of ripple to a third (3 ppm) of the current amount. However, in the high-voltage power supply for an electron gun, a plurality of types of voltage source circuits are adjacently disposed, and thus an electromagnetic noise emitted from one circuit of a transformer and a boost circuit which configure the respective voltage source circuits is applied to the other circuit, increases the ripple, and becomes a disturbance factor that degrades detection accuracy of the load current.

Hence, the present invention provides a technology in which it is possible to reduce the ripple and to realize detection of a load current and a discharge current with high accuracy in a high-voltage power supply for an electron gun of a charged particle beam apparatus, even in a case where a disturbance is applied from an adjacently disposed power supply circuit or the like.

Solution to Problem

The present application includes a plurality of means for solving at least some problems described above, and examples thereof are listed as follows.

In other words, according to the present invention, in order to solve the problems described above, a charged particle beam apparatus is configured to include: a charged-particle optical system having a detector that detects secondary charged particles generated from a sample when the sample is irradiated and scanned with a charged particle beam emitted from an electron gun; a signal processing unit that receives and processes an output signal from the charged-particle optical system, which is obtained from detection of the secondary charged particles by the detector; a high-voltage power supply unit that applies a high voltage to the electron gun; a charged-particle optical system control unit that controls the charged-particle optical system; and a control unit that controls the signal processing unit, the high-voltage source unit, and the charged-particle optical system control unit. The electron gun includes an emitter that releases charged particles, a suppressor electrode that shields thermal electrons released from the emitter, and an extraction electrode and an anode electrode that extract and accelerate charged particles from the suppressor electrode. The high-voltage power supply unit includes a first high-voltage power supply unit that applies a high voltage to the suppressor electrode, a second high-voltage power supply unit that applies a high voltage to the extraction electrode, and a third high-voltage power supply unit that applies a high voltage to the anode electrode. The first high-voltage power supply unit, the second high-voltage power supply unit, and the third high-voltage power supply unit are each grounded via an impedance loop circuit configured by connecting a plurality of impedance elements into a loop shape.

Further, according to the present invention, in order to solve the problems described above, the high-voltage power supply device is configured to include a drive circuit, a transformer that boosts an output voltage of the drive circuit, a boost circuit that further boosts a voltage boosted by the transformer, a shield that covers the transformer and the boost circuit, a filter circuit that filters, smoothes, and outputs a high voltage output from the boost circuit, and an impedance loop circuit configured by connection of a plurality of impedance elements into a loop shape. A grounding point of the boost circuit, a grounding point of the shield, and a grounding point of the filter circuit are configured to be grounded via the impedance loop circuit.

Advantageous Effects of Invention

According to the present invention, even in a case where a disturbance is applied to the adjacently disposed power supply circuit, it is possible to reduce the ripple and to detect a load current, an absorption current, and a discharge current with high accuracy.

Problems, configurations, and effects other than those described above are clarified in the following description of embodiments.

DESCRIPTION OF EMBODIMENTS

According to the present invention, a high-voltage power supply device is configured to be grounded via an impedance loop circuit configured by connecting a plurality of impedance elements into a loop shape. In this manner, even in a case where a disturbance is applied from an adjacently disposed power supply circuit or the like, the ripple is reduced so as to have a small voltage fluctuation.

In addition, the high-voltage power supply device according to the present invention is applied to a charged particle beam apparatus. In this manner, it is possible to detect a load current, an absorption current, and a discharge current on the basis of a stable high-voltage power supply, and thus it is possible to observe and inspect a sample with high accuracy.

Hereinafter, an example in which the high-voltage power supply device of the present invention is applied to an electron gun of the charged particle beam apparatus will be described.

EXAMPLE 1

Figure 1:
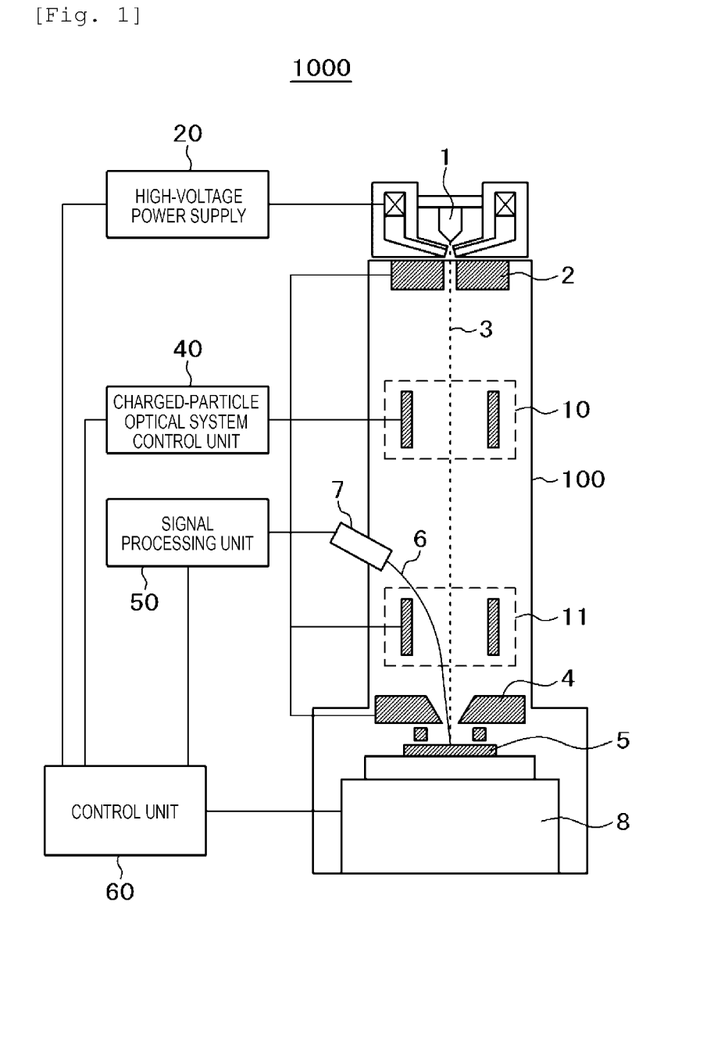
FIG. 1 is a block diagram illustrating a schematic configuration of a charged particle beam apparatus according to Example 1 of the present invention.

FIG. 1 is a diagram illustrating a charged particle beam apparatus according to a first embodiment of the present invention.

A charged particle beam apparatus 1000 includes a main body column 100, a high-voltage power supply 20, a charged-particle optical system control unit 40, a signal processing unit 50, and a control unit 60.

The main body column 100 is configured to include an electron gun 1 that outputs a charged particle beam 3, a focusing lens 2 that focuses the charged particle beam 3, a deflecting electrode 11 that changes a direction of the charged particle beam 3 and controls a position at which the charged particle beam 3 hits a sample 5 mounted on a stage 8, a blanking electrode 10, objective lens 4 that focuses the charged particle beam 3 again, the sample 5 which is a measurement target, secondary charged particles 6 that are released when the charged particle beam 3 hits the sample 5, and a detector 7 that detects the released secondary charged particles.

The high-voltage power supply 20 supplies high-voltage power to the electron gun 1. The charged-particle optical system control unit 40 controls and supplies the power to a converging lens 2, the blanking electrode 10, the deflecting electrode 11, and the objective lens 4. The signal processing unit 50 receives and processes a detection signal from the detector 7 which is obtained by detecting the secondary charged particles 6 and information of a position on the sample 5 that is irradiated with the charged particle beam 3 that is controlled by the deflecting electrode 11, and the signal processing unit generates an image of a surface of the sample 5 and detects a defect thereof. The control unit 60 controls the high-voltage power supply 20, the charged-particle optical system control unit 40, the signal processing unit 50, and the stage 8.

Figure 2:
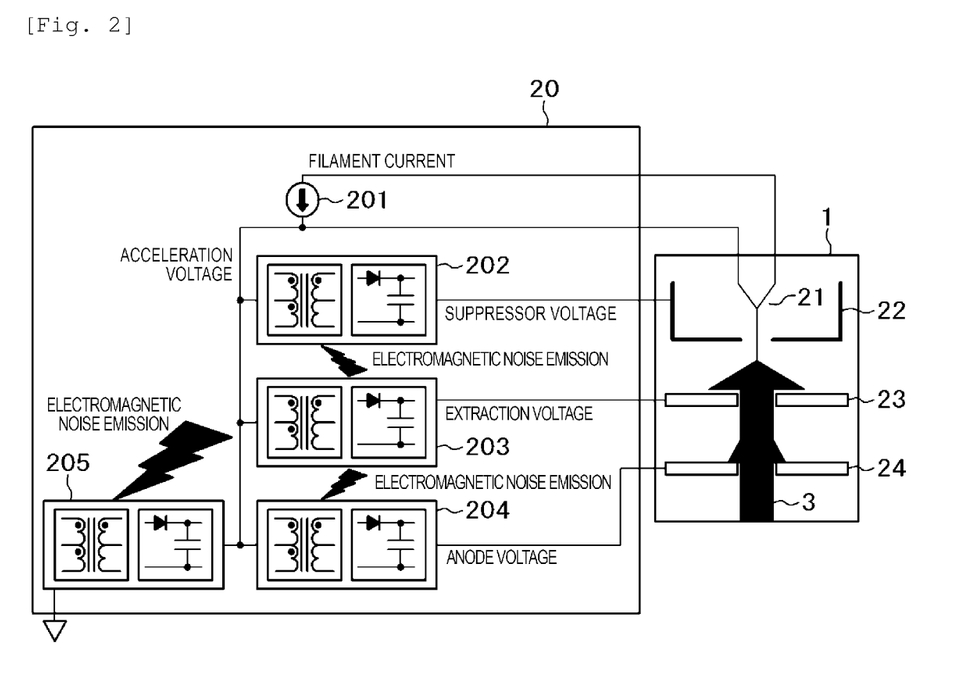
FIG. 2 is a block diagram illustrating a configuration of an electron gun and a high-voltage power supply of the charged particle beam apparatus in FIG. 1.

FIG. 2 is a diagram illustrating a relationship between a detailed configuration of the electron gun 1 and the high-voltage power supply 20 in FIG. 1. The electron gun 1 is configured to include an emitter 21 that releases charged particles, a suppressor electrode 22 that shields thermal electrons released from the emitter 21, and an extraction electrode 23 and an anode electrode 24 that extract and accelerate charged particles. In addition, the emitter 21, the suppressor electrode 22, the extraction electrode 23, and the anode electrode 24 of the electron gun 1 are connected to the high-voltage power supply 20 that applies a voltage and a current each of them.

The high-voltage power supply 20 includes a suppressor voltage source 202 that generates an application voltage of the suppressor electrode 22, an extraction voltage source 203 that generates an application voltage of the extraction electrode 23, an anode voltage source 204 that generates an application voltage of the anode electrode 24, a filament current source 201 that supplies a current to the emitter 21, an acceleration voltage source 205 that generates an acceleration voltage which becomes a reference potential of the emitter 21, the filament current source 201, the suppressor voltage source 202, the extraction voltage source 203, and the anode voltage source 204.

Here, since the high-voltage power supply 20 includes a plurality of voltage source circuits, electromagnetic noises that are emitted from boost circuits mounted to the voltage sources are superimposed on an output voltage, thereby causing degradation of ripples.

Figure 12:
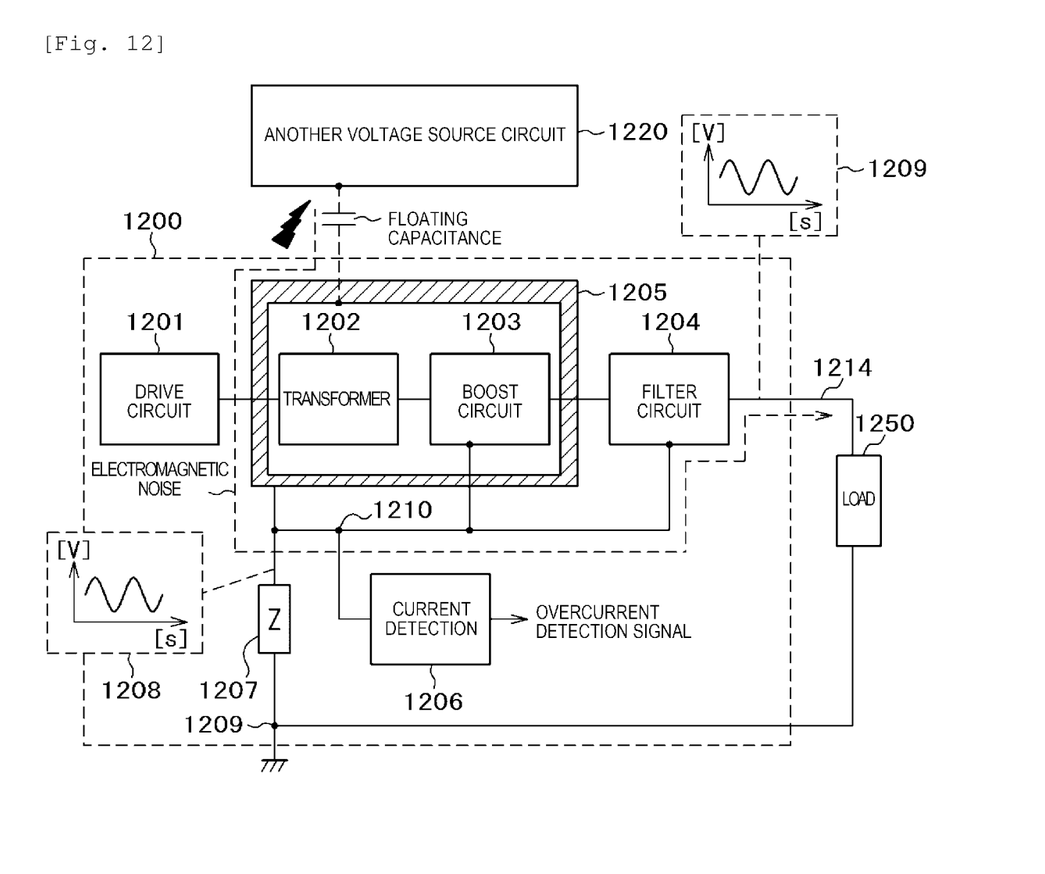
FIG. 12 is a block diagram illustrating a configuration of a high-voltage power supply in the related art.

In FIG. 12, a ripple degradation principle is described by using an example of a high-voltage power supply 1200 in the related art which corresponds to any one of the suppressor voltage source 202, the extraction voltage source 203, or the anode voltage source 204 in FIG. 2. The high-voltage power supply 1200 in the related art includes a drive circuit 1201, a transformer 1202, a boost circuit 1203, a filter circuit 1204, a shield 1205, an overcurrent detecting circuit 1206, and an impedance element 1207. The drive circuit 1201 inputs an AC signal to the transformer 1202, and the transformer 1202 and the boost circuit 1203 boosts a voltage. The filter circuit 1204 smoothes a boosted high voltage and applies the high voltage as a stable high voltage to a load 1250.

A load current that is supplied to the load 1250 by the high-voltage power supply 1200 flows to the load 1250 through the transformer 1202, the boost circuit 1203, and the filter circuit 1204, and a return current flows from the load 1250 through a grounding point 1209 of the high-voltage power supply 1200 and the impedance element 1207 to the transformer 1202. The overcurrent detecting circuit 1206 measures a current (load current) that flows to the load 1250 by detecting a voltage value generated when the return current flows to the impedance element 1207.

Boosting operations in the transformer 1202 and the boost circuit 1203 is performed with several kilovolts of the AC voltage, and thus a large electric field is emitted (field emission). The large electric field generated due to the field emission is subjected to coupling in an output wiring 1214 of the filter circuit 1204, thereby becoming a factor of a ripple increase of the output voltage.

Therefore, in the related art, the transformer 1202 and the boost circuit 1203 are covered with the shield 1205, thereby obtaining means for shielding the electric field emission. For example, in the related art, the shield 1205 is grounded at a connection point 1210 of the impedance element 1207 and the overcurrent detecting circuit 1206. This is because, when the shield 1205 is grounded at the grounding point 1209 of the high-voltage power supply 1200, an AC current flowing by floating capacitance that is formed between the shield 1205 and the transformer 1202 or the boost circuit 1203 becomes a noise of a detection voltage of the overcurrent detecting circuit 1206 when the AC current returns to the transformer 1202 and the boost circuit 1203 through the shield 1205 and via the impedance element 1207, and thus the detection accuracy of the load current by the overcurrent detecting circuit 1206 is degraded.

However, when the shield 1205 is grounded at the connection point 1210 of the impedance element 1207 and the overcurrent detecting circuit 1206, an electromagnetic noise is superimposed to a voltage output through the filter circuit 1204 in a case where the electromagnetic noise is superimposed to the shield 1205, thereby causing an increase in ripples. Further, the electromagnetic noise causes the potential of the connection point 1210 of the impedance element 1207 and the overcurrent detecting circuit 1206 to fluctuate, and the accuracy of detection of the load current is degraded.

Figure 3:
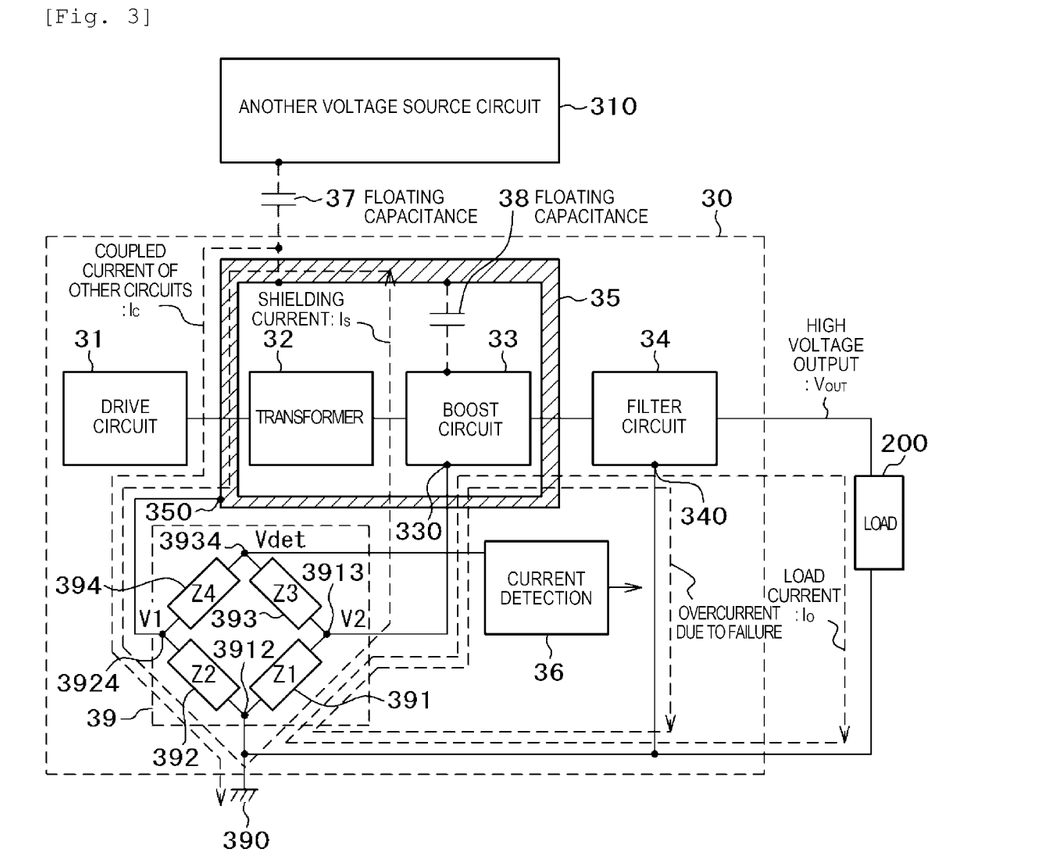
FIG. 3 is a block diagram illustrating an internal configuration of the high-voltage power supply according to Example 1 of the present invention.

FIG. 3 illustrates a configurational example of a plurality of power supplies 202 to 205 of the high-voltage power supply 20 according to the first embodiment of the present invention. Here, the plurality of voltage sources 202 to 205 described in FIG. 2 have basically the same circuit configuration, and thus circuits of the voltage supplies are described as a voltage source circuit 30. The voltage source circuit 30 is configured to include a drive circuit 31, a transformer 32, a boost circuit 33, a filter circuit 34, a shield 35, a current detecting circuit 36, impedance elements Z1: 391, Z2: 392, Z3: 393, and Z4: 394 which configure an impedance loop circuit 39.

The drive circuit 31 inputs the AC signal to the transformer 32, the transformer 32 boosts a voltage, and the boost circuit 33 further boosts the voltage. The filter circuit 34 smoothes the boosted high voltage and applies the high voltage as a stable high voltage to a load 200. The shield 35 covers the transformer 32 and the boost circuit 33.

In a case where the voltage source circuit 30 is the suppressor voltage source 202, the extraction voltage source 203, the anode voltage source 204, and the acceleration voltage source 205, the load 200 is the suppressor electrode 22, the extraction electrode 23, the anode electrode 24, and a combination of the emitter 21, the filament current source 201, the suppressor voltage source 202, the extraction voltage source 203, and the anode voltage source 204, respectively.

The impedance loop circuit 39 is configured by connecting the impedance elements Z1: 391, Z2: 392, Z3: 393, and Z4: 394 into a loop shape. A potential of a connection portion 3912 of Z1: 391 and Z2: 392 is connected to a grounding point 390 of the voltage source circuit 30, a connection portion 3913 of Z1: 391 and Z3: 393 is connected to a grounding point 330 of the transformer 32 and the boost circuit 33, the shield 35 is connected to a connection portion 3924 of Z2: 392 and Z4: 394, the current detecting circuit 36 is connected to a connection portion 3934 of Z3: 393 and Z4: 394, and a grounding point 340 of the filter circuit 34 is connected to the connection portion 3912 of Z1: 391 and Z2: 392.

Figure 4:
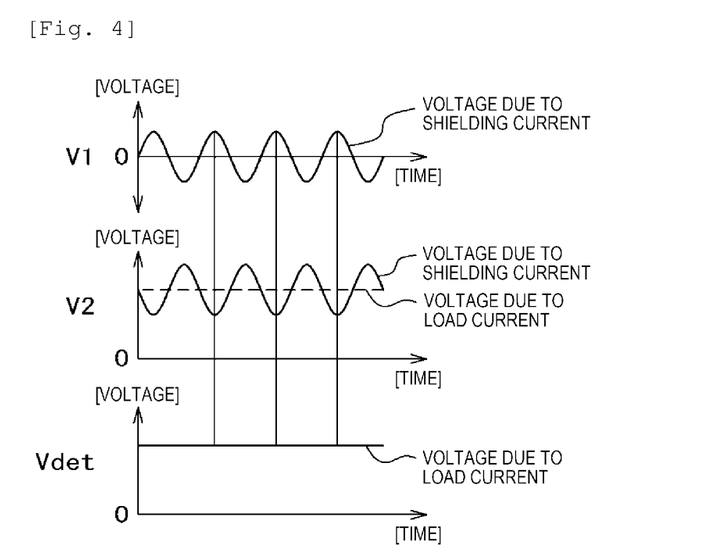
FIG. 4 illustrates voltage waveform graphs of connection portions of impedance elements of the high-voltage power supply according to Example 1 of the present invention.

An operation of the present invention is described by using voltage waveforms of connection portions of the impedance elements in FIG. 4. FIG. 4 illustrates waveforms of V1 representing a voltage of the connection portion 3924 of the impedance elements Z2: 392 and Z4: 394, V2 representing a voltage of the connection portion 3913 of the impedance elements Z1: 391 and Z3: 393, and Vdet representing a voltage of the connection portion 3934 of the impedance elements Z3: 393 and Z4: 394 and illustrates a principle of detecting a load current $I_O$ with high accuracy by the current detecting circuit 36 by removing a noise due to a shielding current Is flowing via floating capacitance 38 between the shield 35, the transformer 32, and the boost circuit 33.

Here, in a case where the impedance elements Z1: 391, Z2: 392, Z3: 393, and Z4: 394 satisfy Expression 1, the shielding current Is forms a loop of returning to the transformer 32 and the boost circuit 33 via the shield 35 and through the impedance elements Z1: 391 and Z2: 392, of which the connection portion 3912 is connected to the earth 390, and the shielding current does not flow to the impedance elements Z3: 393 and Z4: 394 to which the current detecting circuit 36 is connected.

$$Z1 \times Z4 = Z2 \times Z3 \qquad \text{Expression 1}$$

In other words, the shielding current Is does not cause the Vdet representing the voltage of the connection portion 3934 of the impedance elements Z3: 393 and Z4: 394 to fluctuate. On the other hand, the load current $I_O$ flowing to the load 200 forms a loop of returning to the transformer 32 and the boost circuit 33 through the impedance element Z1: 391, and V2 changes by a value of the load current $I_O$. As a result, the voltage Vdet of the connection portion 3934 which is a potential obtained by dividing a potential difference between V1 and V2 to the impedance elements Z3: 393 and Z4: 394 also changes. Hence, an influence from the shielding current Is is removed, and thus it is possible to detect the load current $I_O$ with high accuracy.

Next, an operation of the present invention with respect to the electromagnetic noise from another voltage source circuit 310 (for example, in a case where the voltage source circuit 30 is the suppressor voltage source 202, the other power supply circuit 310 is any one of the extraction voltage source 203, the anode voltage source 204, the filament current source 201, or the acceleration voltage source 205) will be described.

When the electromagnetic noise due to floating capacitance 37 that is generated between other voltage source circuits 310 is superimposed in the shield 35, the noise current Ic flowing to the shield 35 flows into the joining portion 3924 of the impedance elements Z2: 392 and Z4: 394. Here, in a case where the impedance elements Z1: 391, Z2: 392, Z3: 393, and Z4: 394 satisfy Expressions 2 and 3, the noise current Ic flows to the grounding point 390 of the high-voltage power supply via the impedance element Z2: 392 and is unlikely to be returned to the other voltage source circuit 310 which is an electromagnetic noise generating position.

$$Z1 \ll Z3 \quad \text{Expression 2}$$

$$Z2 \ll Z4 \quad \text{Expression 3}$$

For example, when the impedance of Z3: 393 and Z4: 394 is ten times the impedance of Z1: 391 and Z2: 392, fluctuation of the voltage V2 of the joint portion 3913 which is a grounding voltage of the transformer 32 and the boost circuit 33 due to the electromagnetic noise and the voltage Vdet of the joint portion 3934 which is the voltage of current detection is equal to or lower than 5%.

Figure 5:
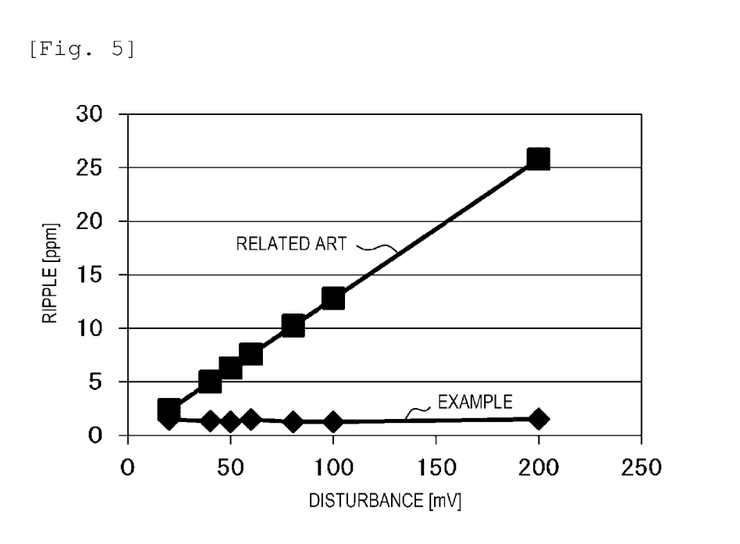
FIG. 5 is a graph obtained by comparing dependences of ripple which is fluctuation of Vdet with respect to an electromagnetic noise as a disturbance in Example 1 of the present invention and the related art.

FIG. 5 illustrates an example of dependences of ripple which is fluctuation of Vdet with respect to the electromagnetic noise as a disturbance in the related art described in FIG. 12 and this example. In the related art, the ripple increases as the disturbance increases; however, the ripple does not depend on the disturbance but is constant in this example. For example, in a case where the disturbance is 60 mV, it is possible to achieve an amount of ripple of 2 ppm in this example with respect to 8 ppm in the related art, and thus it is possible to reduce the ripple.

Figure 6:
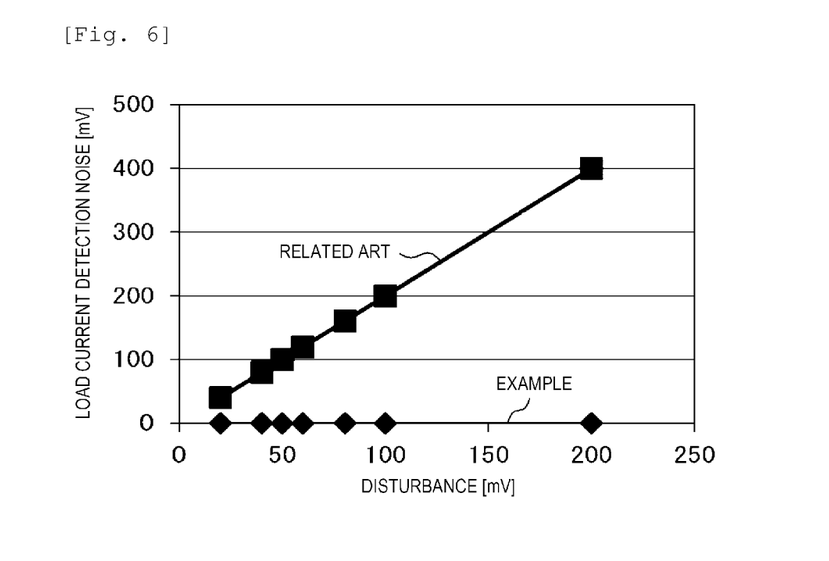
FIG. 6 is a graph obtained by comparing dependences of load current detection noise with respect to the electromagnetic noise as the disturbance in Example 1 of the present invention and the related art.

FIG. 6 illustrates an example of dependences of the load current detection noise with respect to the electromagnetic noise as the disturbance in this example and the related art described in FIG. 12. Regarding such a characteristic, in the related art, the load current detection noise increases as the disturbance increases; however, the load current detection noise does not depend on the disturbance but is constant in this example. For example, in the case where the disturbance is 60 mV, it is possible to achieve the disturbance of 2 mV in this example with respect to 120 mV in the related art, and thus it is possible to reduce the noise.

As described above, according to this example, it is possible to achieve the low ripple and the load current detection with high accuracy.

EXAMPLE 2

In Example 1, the impedance elements Z1: 391, Z2: 392, Z3: 393, and Z4: 394 need to satisfy Expression 1 such that the shielding current Is does not flow into the impedance elements Z3: 393 and Z4: 394 that configure the impedance loop circuit 39. In reality, since there are element variations in the impedance elements Z1 to Z4, it is not possible to obtain precisely the same elements. In this example, even in a case where there are the element variations in the impedance elements Z1 to Z4, means for detecting the load current $I_O$ with accuracy is provided.

Figure 7:
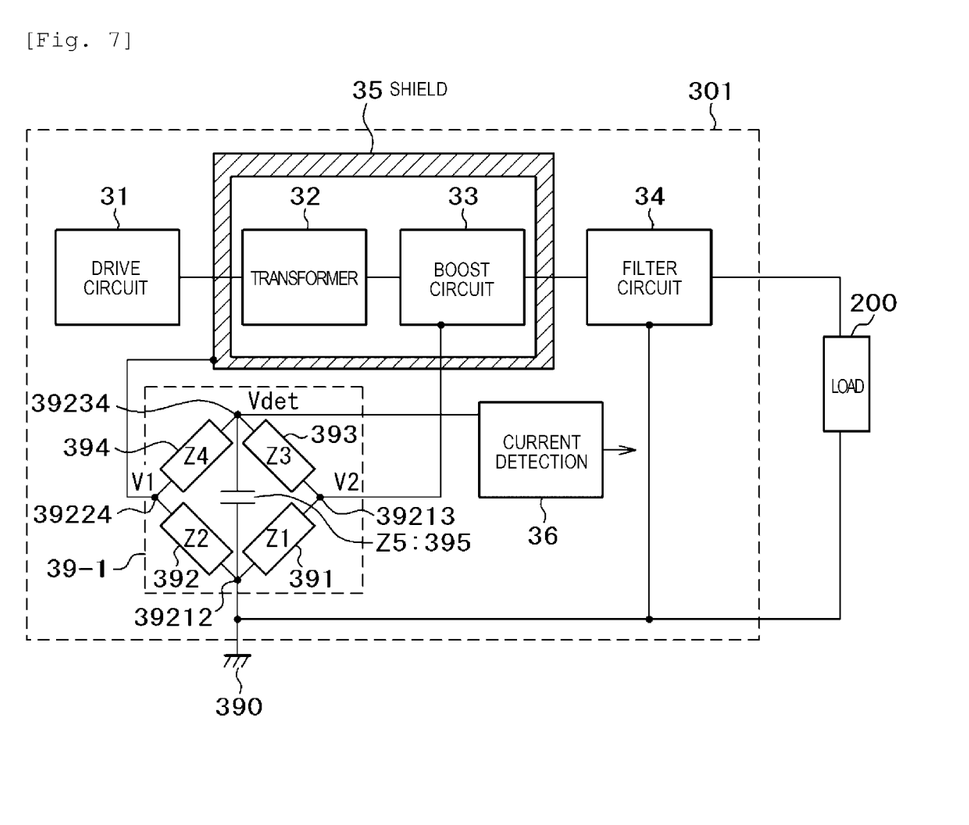
FIG. 7 is a block diagram illustrating an internal configuration of the high-voltage power supply according to Example 2 of the present invention.

FIG. 7 illustrates a configurational example of a voltage power supply circuit 301 of Example 2. The same reference signs are assigned to the same configurations as those described in Example 1, and thus the repeated description thereof is avoided. With respect to the voltage power supply circuit 30 described in Example 1, this example is characterized in that a capacitative element Z5: 395 is connected between a connection portion 39212 of the impedance elements Z1: 391, Z2: 392 and a connection portion 39234 of the impedance elements Z3: 393, and Z4: 394 which configure an impedance loop circuit 39-1.

In a case where the shielding current Is flows to the impedance elements Z3: 393 and Z4: 394, and the potential of Vdet which is a detection potential of the current detecting circuit 36 in the connection portion 39234 fluctuates due to the element variations, the fluctuated voltage flows to the grounding point 390 of the voltage power supply circuit 30 through the capacitative element Z5: 395, and thus it is possible to obtain stable Vdet.

Figure 8:
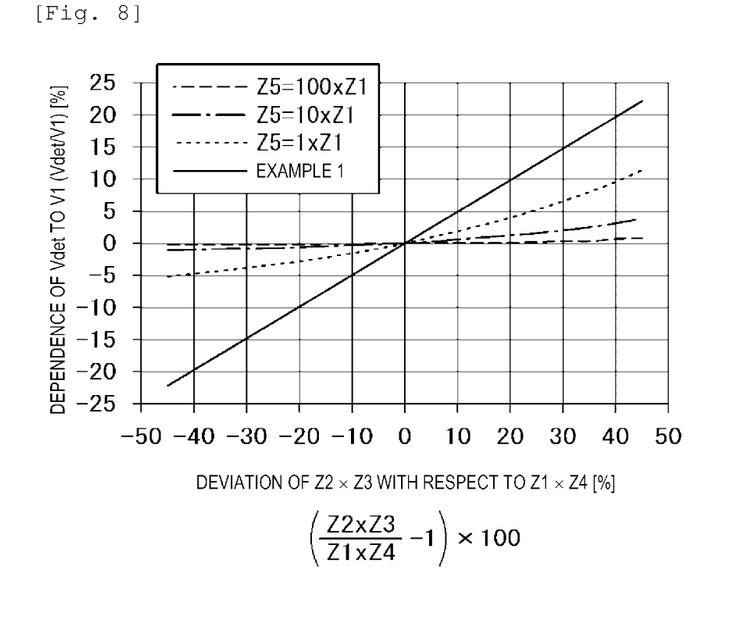
FIG. 8 illustrates a graph of a degree of influence of a shielding current Is on detection accuracy of a load current Io with respect to deviation of an equilibrium condition of impedance elements that configure an impedance loop circuit of the high-voltage power supply according to Example 2 of the present invention, and the vertical axis represents % of fluctuation of a voltage Vdet of a connection portion to fluctuation of a voltage V1 of a connection portion.

FIG. 8 illustrates a degree of influence of the shielding current Is on the detection accuracy of the load current $I_O$ with respect to deviation of an equilibrium condition of the impedance elements described in Expression 1. In FIG. 8, the horizontal axis represents % of deviation of Z2×Z3 with respect to Z1×Z4 ((Z2×Z3)/(Z1×Z4)−1). Regarding signs, plus (+) indicates a case where Z2×Z3 is larger than Z1×Z4, and minus (−) indicates an opposite case thereto. The vertical axis represents % of fluctuation of the voltage Vdet of the connection portion 39234 to fluctuation of the voltage V1 of the connection portion 39224. Regarding signs, plus (+) indicates a case where V1 and Vdet are the same phases, and minus (−) indicates a case of a reverse phase. In addition, a dotted line or a dot-and-dash line indicates how many times a value of the impedance of Z5 is a value of the impedance of Z1.

In the case of Example 1, when the deviation of the equilibrium condition of the impedance element is 10%, 5% of the fluctuation due to the shielding current Is is superimposed on Vdet, and the detection accuracy of the load current $I_O$ is likely to be degraded. By comparison, in this example, the capacitative element Z5: 395 having an impedance value of 100 times the impedance element Z1: 391 is provided, and thereby it is possible to halve the fluctuation due to the shielding current Is to 2.5%. Further, when the impedance value of the capacitative element Z5: 395 is decreased, it is possible to further reduce the fluctuation due to the shielding current Is.

In other words, even in the case where there are element variations in the impedance elements Z1: 391, Z2: 392, Z3: 393, and Z4: 394 that configure the impedance loop circuit 39-1, it is possible to detect the load current $I_O$ with accuracy.

FIG. 8 illustrates an example with Z1 as a reference; however, the reference is not limited, and any one of Z2 to Z4 may be set as the reference.

EXAMPLE 3

In the configuration illustrated in FIG. 3 described in Example 1, when a coupled current Ic (disturbance) from the other voltage source circuit 310 flows, the fluctuation of the voltage of Ic×Z2 with respect to the voltage V1 occurs at the joining point 3924 of the impedance elements Z2 and Z4 which configure the impedance loop circuit 39. By comparison, Ic does not flow to the joining point 3913 of the impedance elements Z1 and Z3, and thus the fluctuation does not occur with respect to the voltage V2. Hence, the voltage Vdet at the joining point 3934 of the impedance elements Z3 and Z4 also fluctuates in association with the fluctuation of the voltage V1 at the joining point 3924.

In this case, an amount of change in Vdet is equal to an amount of change in V1 due to the coupled current Ic (disturbance). In other words, the detection accuracy of the current detecting circuit 36 that detects a load current $I_O$ is likely to be degraded due to the coupled current Ic (disturbance). The same phenomenon occurs in the circuit illustrated in FIG. 7 described in Example 2. Therefore, this example provides means for improving current detection accuracy even in a case where there is a disturbance.

Figure 9:
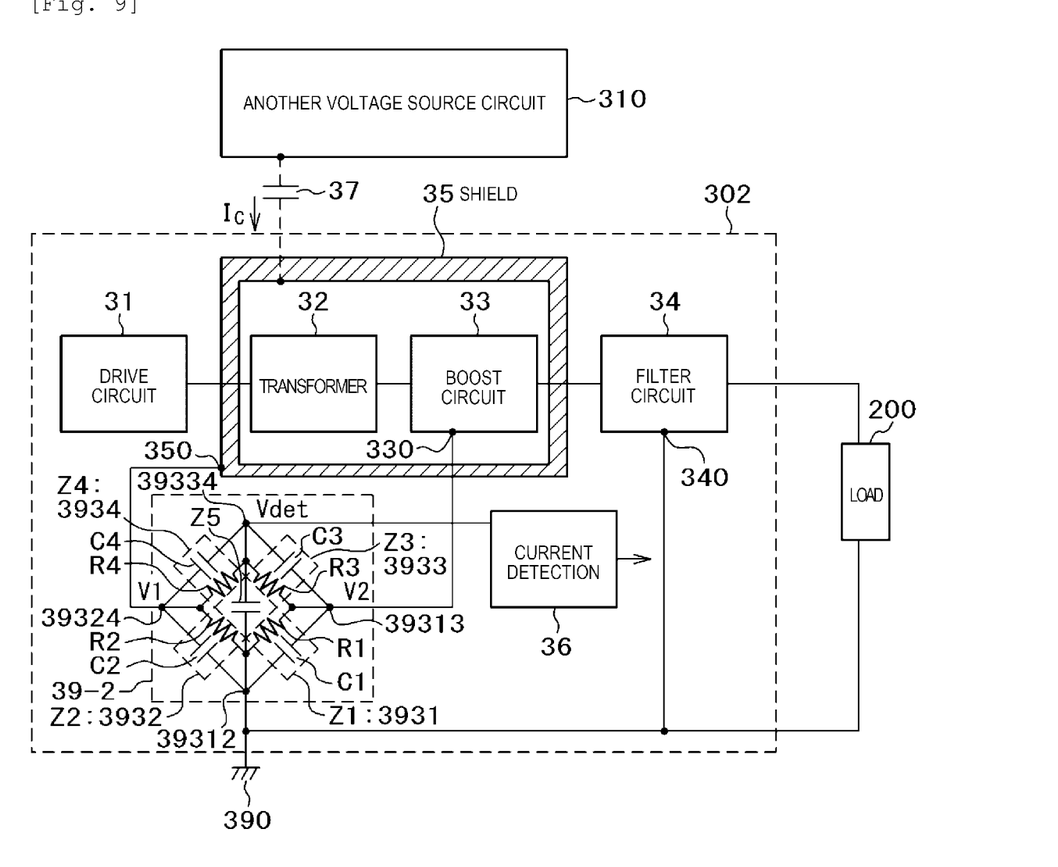
FIG. 9 is a block diagram illustrating an internal configuration of a high-voltage power supply according to Example 3 of the present invention.

FIG. 9 illustrates a configurational example of a voltage source circuit 302 of Example 3. The voltage source circuit 302 in this example has basically the same configuration as that of the voltage source circuit 30 or 301 in the first or second example; however, in a configuration illustrated in FIG. 9, impedance elements Z1: 3931, Z2: 3932, Z3: 3933, and Z4: 3934 configuring a impedance loop circuit 39-2 which are connected at connection portions 39312, 39313, 39334, and 39324 are configured to be connected to capacitative elements C1, C2, C3, and C4 and resistive elements R1, R2, R3, and R4 in parallel, respectively. The configuration is characterized in that resistance values of the resistive elements R1, R2, R3, and R4 is larger than resistance values of the capacitive elements C1, C2, C3, and C4 with respect to a frequency of the electromagnetic noise.

Specifically, the capacitative elements C1, C2, C3, and C4 and the resistive elements R1, R2, R3, and R4 which configure the impedance elements Z1: 3931, Z2: 3932, Z3: 3933, and Z4: 3934 are set to satisfy expressions of Expression 4 to Expression 10.

$$C1 \times C4 = C2 \times C3 \quad \text{Expression 4}$$

$$C1 \gg C3 \quad \text{Expression 5}$$

$$C2 \gg C4 \quad \text{Expression 6}$$

$$R1 \times R4 = R2 \times R3 \quad \text{Expression 7}$$

$$R1 \ll R3 \quad \text{Expression 8}$$

$$R2 \ll R4 \quad \text{Expression 9}$$

$$\frac{1}{2 \times \pi \times Fd \times Cn} < Rn \quad (n = 1, 2, 3, 4) \quad \text{Expression 10}$$

The other adjacently disposed voltage source circuit 310 is considered at a generation position of the electromagnetic noise which is the disturbance. In the other voltage source circuit 310, a frequency Fd of an electric field which is emitted from a transformer or a boost circuit is several kilohertz to tens of kilohertz. On the other hands, a bandwidth (width of fluctuation) in which the potential of Vdet changes at the joining point 39334 due to the load current $I_O$ is fluctuation (hundreds of hertz) in the order of milliseconds, and thus there is a difference of tens of times to hundreds of times in frequency of an electric field that is emitted from the other voltage source circuit 310 which is the disturbance.

Hence, the impedance values of the capacitative elements C1, C2, C3, and C4 in consideration of the electromagnetic noise as the disturbance is one several-tenth to one several-hundredth of an impedance value in consideration of the bandwidth of Vdet.

In other words, when the impedance in the bandwidth of Vdet is Zdet, impedance of the disturbance: Znois satisfies a relationship of Znois=Zdet/10 to 100, and an amount of change in Vdet as the current detection voltage is one several-tenth to one several-hundredth with respect to an amount of change in the load current $I_O$. In this manner, it is possible to detect the current without degrading the current detection accuracy even in a case there is a disturbance.

EXAMPLE 4

In Examples 1 to 3, during transition of the output voltage of the high-voltage power supply which is configured to have the transformer 32 and the boost circuit 33, a current that charges or discharges the capacitative element constituting the filter circuit 34 flows. In a case where this charge/discharge current also flows to the impedance element Z1: 391, and a value of the charge/discharge current exceeds a value of the load current $I_O$ that is considered as an abnormal value in the current detecting circuit 36, the current detecting circuit 36 performs false detection of apparatus failure.

Therefore, it is necessary to control a transition time of the output voltage such that the charge/discharge current flowing due to the transition of the output voltage is equal to or lower than a load current that is considered as an abnormal value. The embodiment provides an output voltage transitioning means that satisfies the following description.

Figure 10:
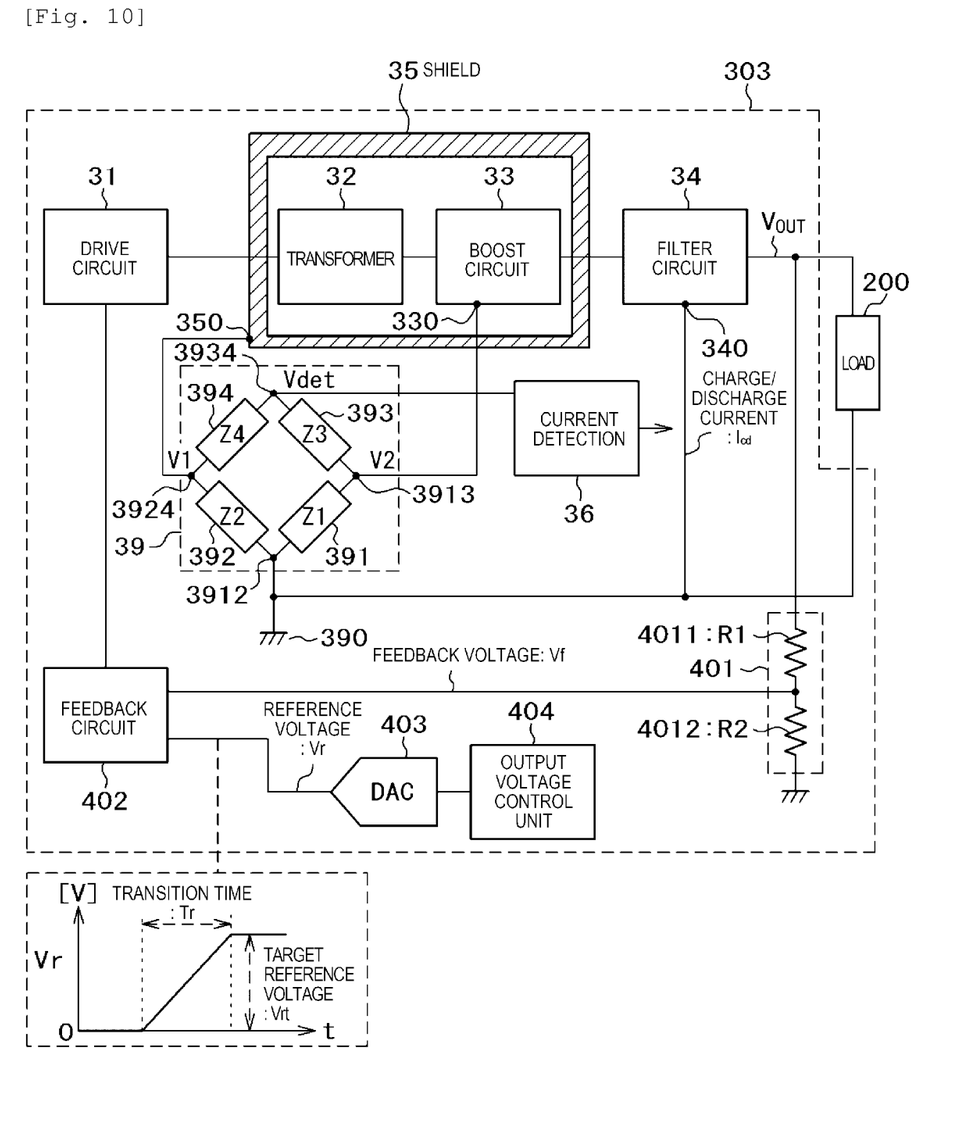
FIG. 10 is a block diagram illustrating an internal configuration of a high-voltage power supply according to Example 4 of the present invention.

FIG. 10 illustrates a configurational example of a voltage source circuit 303 of Example 4. The voltage source circuit 303 illustrated in FIG. 10 is configured to further include an output voltage dividing unit 401 that divides a high voltage output Vout from the filter circuit 34 in proportion to a ratio of resistance values of a resistor R1: 4011 and a resistor R2: 4012 and generates a feedback voltage Vf, a digital-analog converter 403 and an output voltage control unit 404 which generate a reference voltage Vr for determining the high voltage output Vout, and a feedback circuit 402 that compares the feedback voltage Vf to the reference voltage Vr and controls the drive circuit 31 in the voltage source circuit 30 described in Example 1.

FIG. 10 illustrates an example of the voltage source circuit 30 described in Example 1; however, the voltage source circuit may be replaced with the voltage source circuit 301 described in Example 2 or the voltage source circuit 302 described in Example 3.

Here, the output voltage control unit 404 controls a time Tr in which the reference voltage Vr of the digital-analog converter 403 for determining the high voltage output Vout is caused to transition to a target reference voltage Vrt such that a charge/discharge current Icd that is generated in an initial period of power supply is equal to or lower than an abnormal value of the load current $I_O$ (a value set by the current detecting circuit 36 in advance).

Specifically, the transition time Tr of the reference voltage Vr, an abnormal value Iarm of the load current Io, a capacitative element value Cf of the filter circuit 34, and a change amount ΔV of the output voltage Vout satisfy the following expression.

$$\frac{Cf \times \Delta V}{Iarm} < Tr \quad \text{Expression 11}$$

As described above, it is possible to avoid false detection of apparatus failure due to the charge/discharge current Ic of the capacitative element (not illustrated) of the filter circuit 34, which is obtained when the output voltage is caused to transition.

EXAMPLE 5

Figure 11:
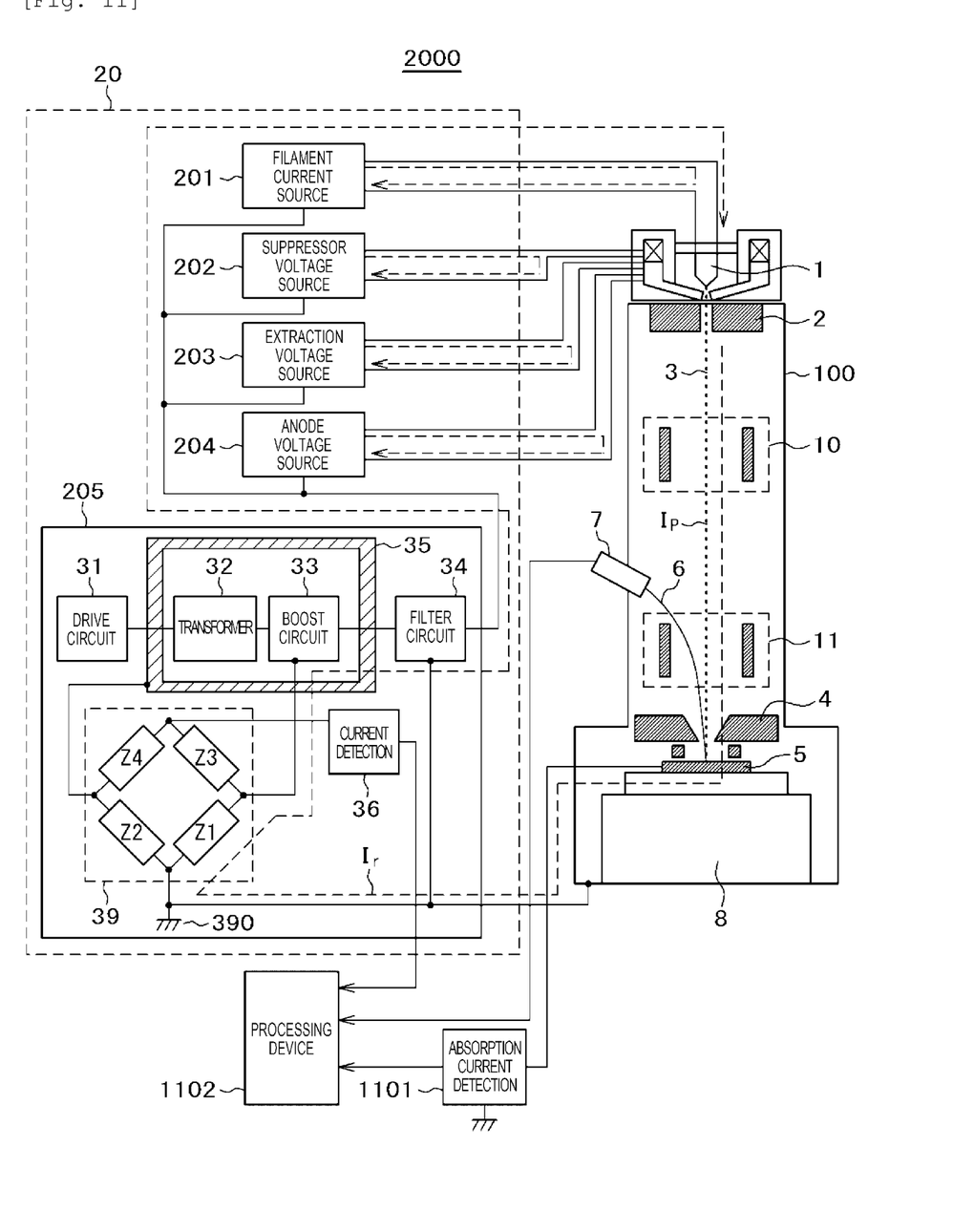
FIG. 11 is a block diagram illustrating a configuration of a charged particle beam apparatus according to Example 5 of the present invention.

In the fifth example, in a charged particle beam apparatus 2000 using the voltage source circuit 30, 301, 302, or 303 described in Examples 1 to 4, there is provided means for performing detection with high accuracy in a measurement method using an absorption current that is electric charge obtained through absorption of the charged particle beam into the sample 5 that is irradiated as a measurement target with the charged particle beam from the electron gun 1.

Incidentally, a probe current as a current amount of the charged particle beam, with which the sample is irradiated, is a load current of the high-voltage power supply for the electron gun and is not constant due to the disturbance. However, in a measurement method using an absorption current disclosed in NPTL 1, the measurement is performed by assuming that the probe current is constant, and thus fluctuation of the probe current becomes a measurement error. In this example, the probe current is detected with accuracy, thereby, realizing high accuracy of the measurement method using the absorption current.

FIG. 11 illustrates an example of the charged particle beam apparatus 2000 according to Example 5. A configuration of a column 100 including an electron optical system in the charged particle beam apparatus 2000 is the same as the configuration described in Example 1 with reference to FIG. 1.

The configuration differs from the configuration of the charged particle beam apparatus 1000 described in FIG. 1 in that an absorption current detector 111 that detects an absorption current into the sample 5 irradiated with the charged particle beam 3 and a processing device 1102 that performs a desired signal process in response to an output signal of the acceleration voltage power supply 205, the absorption current detector 111, and the detector 7 are provided.

In the configuration of the charged particle beam apparatus 2000 illustrated in FIG. 11, the charged particle-optical system control unit 40 and the control unit 60 illustrated in the configuration of the charged particle beam apparatus 1000 described in Example 1 with reference to FIG. 1 are omitted.

In this configuration, the filament current source 201, the suppressor voltage source 202, the extraction voltage source 203, and the anode voltage source 204 are grounded to the output voltage of the filter circuit 34 of the acceleration voltage source 205, and the acceleration voltage source 205 and the sample 5 as the measurement target are configured as common grounding points.

At this time, a probe current Ip which is a current amount of the charged particle beam 3 flows as a return current Ir of the acceleration voltage source 205 to the impedance element Z1 Hence, the return current Ir flowing to Z1 can be reflected to Vdet such that the current detector 36 can detect the probe current Ip. The detected probe current Ip and the absorption current detected by the absorption current detector 111 are subjected to a desired calculation process by the processing device 112 by using information of current values of a secondary electron or a reflected electron detected by the detector 7, and thereby it is possible to create an image and to realize the high accuracy of the measurement method by using the secondary electron, the reflected electron, and the absorption current.

REFERENCE SIGNS LIST

1: electron gun
2: focusing lens
3: charged particle beam
4: objective lens
5: sample
6: secondary charged particles
7: detector
20: high-voltage power supply
21: emitter
22: suppressor electrode
23: extraction electrode
24: anode electrode
31: drive circuit
32: transformer
33: boost circuit
34: filter circuit
35: shield
36: current detecting circuit

The invention claimed is:

1. A charged particle beam apparatus comprising:
a charged-particle optical system having a detector that detects secondary charged particles generated from a sample when the sample is irradiated and scanned with a charged particle beam emitted from an electron gun;
a signal processing unit that receives and processes an output signal from the charged-particle optical system, which is obtained from detection of the secondary charged particles by the detector;
a high-voltage power supply unit that applies a high voltage to the electron gun;
a charged-particle optical system control unit that controls the charged-particle optical system; and
a control unit that controls the signal processing unit, the high-voltage source unit, and the charged-particle optical system control unit,
wherein the electron gun includes an emitter that releases charged particles, a suppressor electrode that shields thermal electrons released from the emitter, and an extraction electrode and an anode electrode that extract and accelerate charged particles from the suppressor electrode,
wherein the high-voltage power supply unit includes a first high-voltage power supply unit that applies a high voltage to the suppressor electrode, a second high-voltage power supply unit that applies a high voltage to the extraction electrode, and a third high-voltage power supply unit that applies a high voltage to the anode electrode, and
wherein the first high-voltage power supply unit, the second high-voltage power supply unit, and the third high-voltage power supply unit are each grounded via an impedance loop circuit configured by connecting a plurality of impedance elements into a loop shape.

2. The charged particle beam apparatus according to claim 1,
wherein each of the first high-voltage power supply unit, the second high-voltage power supply unit, and the third high-voltage power supply unit includes a drive circuit, a transformer that boosts an output voltage of the drive circuit, a boost circuit that further boosts a voltage boosted by the transformer, a shield that covers the transformer and the boost circuit, and a filter circuit that filters and smoothes an output from the boost circuit, and wherein a grounding point of the boost circuit, a grounding point of the shield, and a grounding point of the filter circuit are connected to respective different connection portions of the plurality of impedance elements which configure the impedance loop circuit and are connected into the loop shape.

3. The charged particle beam apparatus according to claim 2, wherein the grounding point of the filter circuit is connected to a grounding point of the impedance loop circuit.

4. The charged particle beam apparatus according to claim 1, wherein the impedance loop circuit is configured by connecting four impedance elements into a loop shape, one connection portion of the connection into the loop shape is grounded, and the disposed connection portion and a connection portion at a position opposite to the grounded connection portion of the connection portions of the connection into the loop shape are connected to a capacitive element.

5. The charged particle beam apparatus according to claim 1, wherein the impedance elements that configure the impedance loop circuit are each configured by combining a resistance element and a capacitive element.

6. The charged particle beam apparatus according to claim 1, further comprising:

an absorption current detector that detects an absorption current of the sample;

a load current detector that detects a load current of the electron gun; and a processing device that calculates and processes a secondary over-charged particle detection signal detected by the detector of the charged-particle optical system by using a load current detection signal detected by the load current detector and an absorption current detection signal detected by the absorption current detector.

7. A high-voltage power supply device comprising:

a drive circuit;

a transformer that boosts an output voltage of the drive circuit;

a boost circuit that further boosts a voltage boosted by the transformer;

a shield that covers the transformer and the boost circuit;

a filter circuit that filters, smoothes, and outputs a high voltage output from the boost circuit, and an impedance loop circuit that is configured by connecting a plurality of impedance elements into a loop shape, wherein a grounding point of the boost circuit, a grounding point of the shield, and a grounding point of the filter circuit are grounded via the impedance loop circuit.

8. The high-voltage power supply device according to claim 7, wherein the grounding point of the filter circuit is connected to a grounding point of the impedance loop circuit.

9. The high-voltage power supply device according to claim 7, wherein the impedance loop circuit is configured by connecting four impedance elements into a loop shape, one connection portion of the connection into the loop shape is grounded, and the disposed connection portion and a connection portion at a position opposite to the grounded connection portion of the connection portions of the connection into the loop shape are connected to a capacitive element.

10. The high-voltage power supply device according to claim 7, wherein the impedance elements that configure the impedance loop circuit are each configured by combining a resistance element and a capacitive element.

* * * * *